(12) United States Patent
Denes

(10) Patent No.: US 9,484,520 B2
(45) Date of Patent: Nov. 1, 2016

(54) METHOD FOR PRODUCING FLEXIBLE EAP GENERATORS

(75) Inventor: Istvan Denes, Waiblinge/Hohenacker (DE)

(73) Assignee: ROBERT BOSCH GMBH, Stuttgart (DE)

( * ) Notice: Subject to any disclaimer, the term of this patent is extended or adjusted under 35 U.S.C. 154(b) by 162 days.

(21) Appl. No.: 14/235,843

(22) PCT Filed: Jul. 16, 2012

(86) PCT No.: PCT/EP2012/063879
§ 371 (c)(1),
(2), (4) Date: May 13, 2014

(87) PCT Pub. No.: WO2013/017399
PCT Pub. Date: Feb. 7, 2013

(65) Prior Publication Data
US 2014/0239775 A1     Aug. 28, 2014

(30) Foreign Application Priority Data
Jul. 29, 2011   (DE) .......................... 10 2011 080 128

(51) Int. Cl.
*H01L 41/04* (2006.01)
*H01L 41/083* (2006.01)
*H01L 41/193* (2006.01)
*H01L 41/047* (2006.01)
*H01L 41/27* (2013.01)
*H01L 41/22* (2013.01)
*H01L 41/09* (2006.01)
*H01L 41/113* (2006.01)

(52) U.S. Cl.
CPC ....... *H01L 41/0835* (2013.01); *H01L 41/0471* (2013.01); *H01L 41/0966* (2013.01); *H01L 41/1136* (2013.01); *H01L 41/193* (2013.01); *H01L 41/22* (2013.01); *H01L 41/27* (2013.01)

(58) Field of Classification Search
CPC .......................... H01L 41/092; H01L 41/193
USPC ......................................................... 310/328
See application file for complete search history.

(56) References Cited

U.S. PATENT DOCUMENTS 4,330,730 A * 5/1982 Kurz ..................... H01L 41/094
310/330
5,559,387 A * 9/1996 Beurrier .............. H01L 41/0836
310/328

(Continued)

FOREIGN PATENT DOCUMENTS

DE          19938456       2/2001
DE        102009054035     5/2011

(Continued)

OTHER PUBLICATIONS

International Search Report for PCT/EP2012/063879, issued on Oct. 8, 2012.

*Primary Examiner* — J. San Martin
(74) *Attorney, Agent, or Firm* — Norton Rose Fulbright LLP

(57) ABSTRACT

In a method for manufacturing electroactive polymer generators, a strip, including one layer of an electroactive polymer and electrodes applied to sections of this layer, is spirally wound in such a way that multiple electrodes are situated congruently on top of each other, in each case two electrodes situated on top of each other being separated from each other by a layer of electroactive polymer.

9 Claims, 3 Drawing Sheets

(56) References Cited

U.S. PATENT DOCUMENTS

| | | | |
|---|---|---|---|
| 6,437,489 B1 * | 8/2002 | Shinke | H01L 41/0475 310/367 |
| 6,545,395 B2 * | 4/2003 | Matsui | H01L 41/39 310/330 |
| 6,664,718 B2 | 12/2003 | Pelrine et al. | |
| 7,108,778 B2 * | 9/2006 | Simpson | A61B 5/14532 204/403.09 |
| 2003/0117044 A1 * | 6/2003 | Urano | F04B 43/0054 310/367 |
| 2004/0217671 A1 | 11/2004 | Rosenthal et al. | |
| 2007/0269685 A1 * | 11/2007 | Chu | H01M 2/263 429/3 |

FOREIGN PATENT DOCUMENTS

| | | |
|---|---|---|
| WO | WO2007/029275 | 3/2007 |
| WO | WO2009/135328 | 11/2009 |

* cited by examiner

METHOD FOR PRODUCING FLEXIBLE EAP GENERATORS

BACKGROUND OF THE INVENTION

1. Field of the Invention

The present invention relates to a method for producing flexible electroactive polymer generators.

2. Description of the Related Art

Electroactive polymers (EAP) are polymers which change their shape when an electric voltage is applied. As a result, electroactive polymers are usable as actuators. However, electroactive polymers also allow an operation in the manner of a generator, in which a mechanically induced expansion of the electroactive polymer is directly converted into electrical energy. Such energy converters are referred to as EAP generators. The conversion of the expansion of the electroactive polymer into electrical energy takes place on a capacitive basis by the shifting of charges. During the conversion of mechanical energy into electrical energy with the aid of electroactive polymers, the EAP generator, including at least one component which has two resilient electrodes between which a tier made of electroactive polymer is situated, is strained as a result of the action of an external force. In the state of maximal strain of the EAP generator, the electroactive polymer is acted upon by electrical charges below the breakdown field strength. When the action of the external force is reduced, the electroactive polymer relaxes due to its elasticity. During this phase, the energy stored in the EAP generator increases. This process constitutes the actual conversion of the mechanical into the electrical energy. As soon as the EAP generator is completely relaxed, the electroactive polymer which is acted upon by an electrical charge is discharged, whereby the EAP generator rewinds to its original length. The energy generation cycle may start again.

EAP generators may have multiple layers, each including two electrodes between which a tier made of electroactive polymer is situated, the layers being combined to form one stack or multiple stacks. These stacks are referred to as EAP stacks. For the present invention, however, the term 'EAP stack' is also understood to mean specific embodiments which have only one layer made of two electrodes having an interposed tier made of electroactive polymer. EAP stacks within the sense of the present invention are thus stacks which have at least one layer, including two preferably flexible electrodes and a tier made of electroactive polymer situated between the two electrodes.

Various methods for manufacturing EAP stacks are known from the related art. According to one method, individual layers, including two electrodes between which a tier made of electroactive polymer is situated, are placed on top of each other and then wired together from the outside.

An EAP generator and a method for manufacturing EAP stacks are known from published German patent application document DE 10 2009 054 035 A1, for example.

The EAP stacks manufactured with the known methods are usable as actuators or as generators. However, these EAP stacks are only effective with a deformation in the direction of their longitudinal axis, but not during deflection.

BRIEF SUMMARY OF THE INVENTION

The present invention provides a method for manufacturing EAP generators or EAP stacks which are able to generate electrical energy from deflection movements and which are movable, in particular bendable, by the action of electrical energy. Moreover, EAP generators or EAP stacks are provided which are able to generate electrical energy from deflections of the EAP stacks contained therein and which are movable, in particular bendable, by the action of electrical energy. In one further aspect, the present invention relates to the use of the EAP generators or EAP stacks for the generation of electrical energy from kinetic energy, in particular from the energy of deflection movements. The present invention also provides a method for generating electrical energy from the deflection of EAP stacks. The present invention further relates to the use of the EAP generators and EAP stacks according to the present invention as actuators.

In a first aspect, the present invention provides a method for manufacturing EAP generators which have at least one EAP stack, or for manufacturing EAP stacks which are able to generate electrical energy from deflection movements and which are movable, in particular bendable, by the action of electrical energy. For EAP generators to be able to convert the mechanical energy of deflection movements into electrical energy, it is necessary to divide the electrodes into at least two sectors relative to the cross section of the EAP stack or stacks. The method according to the present invention is characterized in that a flat strip, including a layer of an electroactive polymer and electrodes which are applied to sections of this layer, is spirally wound in such a way that multiple electrodes are situated congruently on top of each other, in each case two electrodes which are situated on top of each other being separated from each other by at least one layer of electroactive polymer. The electrodes which are congruently situated on top of each other here are not electrodes which directly adjoin each other relative to the strip.

The individual windings of the spiral resulting from the winding process are joined to each other or held together. For this purpose, in each case two immediately consecutive windings may be glued, welded or sealed to each other. However, it is also possible to introduce the spiral-shaped stacks into a flexible envelope, such as a hose, and to close the same at its opposing ends, so that a gap formation between the individual windings of the EPA stack is prevented. The latter specific embodiment has the advantage that the EAP stack is protected from harmful environmental influences.

The strip which is used for the method according to the present invention includes a layer made of electroactive polymer and a discontinuous layer made of electrodes which are applied to one of the two mutually opposing surfaces of the layer made of electroactive polymer. The electrodes may be applied to sections of the surface of the strip-shaped layer made of electroactive polymer with the aid of printing, vacuum deposition or other coating methods.

The winding of the strip is carried out in such a way that each winding of the spiral resulting from the spiral-shaped winding of the strip has at least two immediately consecutive electrodes which are applied to sections of the layer made of electroactive polymer. Each winding of the manufactured spiral thus has at least two separate electrodes. The strip is preferably wound to form a spiral in such a way that the spiral has three or four separate electrodes per winding. This means that every second, preferably every third or every fourth, of the electrodes which are applied to the layer made of electroactive polymer are situated congruently on top of each other in the EAP stack. However, it is also possible to provide more electrodes per winding. The individual electrodes thus represent circle or ring segments in the cross section of the spiral. The collectivity of the electrodes situated congruently on top of each other in the spiral thus represents a cylinder sector or a ring sector. An EAP stack having two electrodes per winding thus has two cylinder or ring sectors, an EAP stack having three electrodes per winding has three cylinder or ring sectors, and an EAP stack having four electrodes per winding has four cylinder or ring sectors. In the method the winding of the strip is carried out in such a way that every second, third or fourth electrodes of the strip in the stack are situated congruently on top of each other.

The strips used for the method according to the present invention have a discontinuous coating of flexible, planar electrodes only on one side of the strip-shaped layer made of electroactive polymer. As a result of the spiral-shaped winding of the strip, a spiral is generated in which the electrodes of a winding which are applied to the layer of electroactive polymer are brought into contact with the layer of electroactive polymer of the subsequent winding. Based on each individual winding of the spiral, the electrodes applied to the strip-shaped layer made of electroactive polymer thus represent the signal electrodes for the areas of the electroactive polymer to which they are applied, and the ground electrodes for the areas of the electroactive polymer of the subsequent winding with which they were brought in contact as a result of the winding process. Each of the electrodes in the EAP stack thus at the same time functions as a ground electrode for a section of the strip-shaped layer made of electroactive polymer and as a signal electrode for another section of the strip-shaped layer made of electroactive polymer. The electroactive polymer is not electrically conducting, so that no short circuit occurs between the ground electrode and the signal electrode of the same segment.

To ensure the integrity and functionality of the ring or cylinder sectors in the EAP stack, precise positioning of the electrodes on top of each other is important, since the deflection of the EAP stack may only be efficiently converted into electrical energy in the case of precise congruent positioning of the electrodes on top of each other. To achieve this, the strip is wound around a rod in one preferred specific embodiment of the method according to the present invention. In the simplest specific embodiment, the rod has a circular or oval cross section. The rod preferably has a triangular, quadrangular, polygonal or star-shaped cross section, the strip on its side which determines the inner circumference of the spiral having projections and/or recesses, which are designed in such a way that form-locked winding of the strip with the rod and around the rod may be carried out. In the method according to the present invention, the strip is therefore wound with the rod around the rod in a form-locked manner. The use of such rods as a winding core, which is removable from the interior of the spiral after the spiral has been manufactured, allows precise positioning of the electrodes.

After the spiral has been wound, the rod may be removed from the cavity of the spiral so that an essentially tubular EAP stack is manufactured. However, after the spiral has been wound, the rod may also remain in the cavity of the spiral, provided that the rod is so flexible that the bending property of the spiral is not impaired. In this embodiment, the manufactured EAP stack is essentially cylindrical.

In a second aspect, the present invention relates to EAP generators, including at least one EAP stack or EAP stacks which is/are producible with the method according to the present invention.

The EAP stacks according to the present invention include a spirally wound strip which has one layer of an electroactive polymer and electrodes applied to sections of this layer, multiple electrodes which do not directly adjoin each other on the strip being congruently situated on top of each other, in each case two electrodes which are situated on top of each other being separated from each other by at least one layer of electroactive polymer.

The EAP generators according to the present invention include at least one EAP stack having two, three or four ring sectors, which represent electrodes congruently situated on top of each other. Each winding of an EAP stack accordingly has two, three or four separate electrodes.

The EAP stacks have a cavity which extends in the center of the spiral in the longitudinal direction thereof. This cavity is delimited by the inner circumference of the spiral. In particular specific embodiments, the spiral may include a rod in its cavity. The rod may have a circular, oval, triangular, quadrangular, polygonal or star-shaped cross section. The rod is preferably surrounded by the spiral in a form-locked manner.

The present invention also relates to the use of EAP generators, including at least one EAP stack which includes a spirally wound strip, which has one layer of an electroactive polymer and electrodes applied to sections of this layer, multiple electrodes which do not directly adjoin each other on the strip being situated congruently on top of each other in this stack, in each case two electrodes situated on top of each other being separated by a layer of electroactive polymer, for the generation of electrical energy, in particular for the generation of electrical energy by the conversion of the mechanical energy from deflection movements of the EAP stack. The present invention thus also includes methods for generating electrical energy by converting the mechanical energy from deflection movements of the EAP stack into electrical energy.

The present invention also relates to the use of EAP generators, including at least one EAP stack which includes a spirally wound strip, which has one layer of an electroactive polymer and electrodes applied to sections of this layer, multiple electrodes which do not directly adjoin each other on the strip being situated congruently on top of each other, in each case two electrodes situated on top of each other being separated from each other by a layer of electroactive polymer, as actuators, in particular as actuators which are able to carry out a deflection movement.

The present invention is described in greater detail hereafter based on the drawings, the drawings serving only illustration purposes without limiting the present invention.

DETAILED DESCRIPTION OF THE INVENTION

Figure 1:
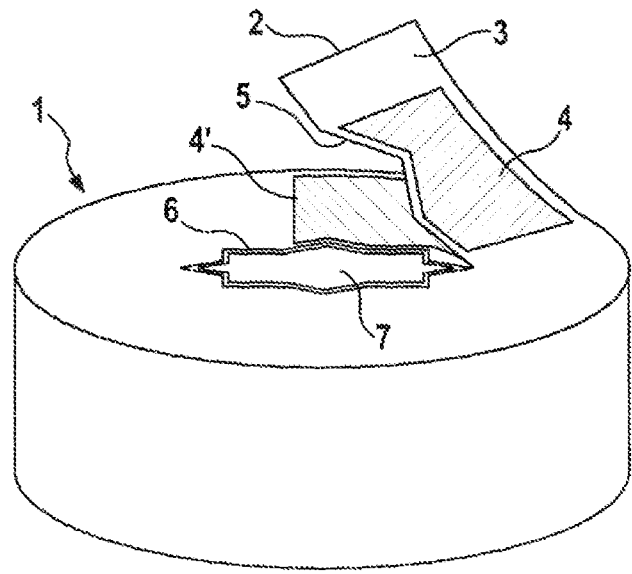
FIG. 1 shows a schematic sketch of a spirally wound EAP stack.

FIG. 1 shows a schematic sketch of a spirally composed EAP stack. EAP stack 1 is based on a strip 2 which is spirally wound. Strip 2 includes a layer 3 made of electroactive polymer and planar electrodes 4, 4' applied to sections of this layer 3. Strip 2 is spirally wound in such a way that two planar electrodes 4, 4' which are not immediately consecutive are situated congruently on top of each other, a layer 3 made of electroactive polymer being situated in each case between two electrodes which are situated congruently on top of each other.

The circumference of EAP stack 1 shown is circular; however, it may also have a different cross-sectional shape. Strip 2 is spirally wound in such a way that a cavity 5 is created, which is delimited by the inner circumference of spiral 1. Cavity 6 extends in the longitudinal direction of EAP stack 1 along the longitudinal axis of EAP stack 1. In the specific embodiment shown, cavity 6 does not have a circular cross section, but a star-shaped cross section. This star-shaped cross section of cavity 6 results from the spiral-shaped winding of strip 2, which has recesses 5 at certain intervals along the inner edge of strip 2, which form the inner circumference of the spiral. Recesses 5 are preferably situated at regular intervals from each other along the inner edge of strip 2.

During the manufacture of shown EAP stack 1, strip 2 is wound around a rod 7 having a star-shaped cross section. Since recesses 5 of strip 2 surround the points of star-shaped rod 7 in a form-locked manner, exact positioning of planar electrodes 4, 4' on top of each other during the winding of the spiral is made possible.

Figure 2A:
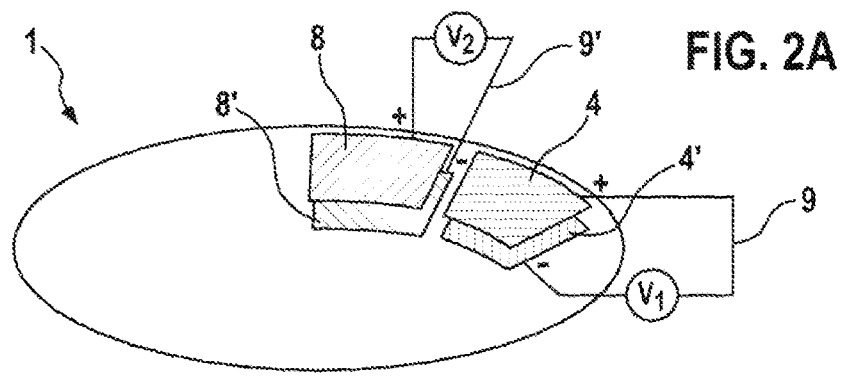
FIGS. 2A and 2B show two different embodiments of the EAP stack.
Figure 2B:
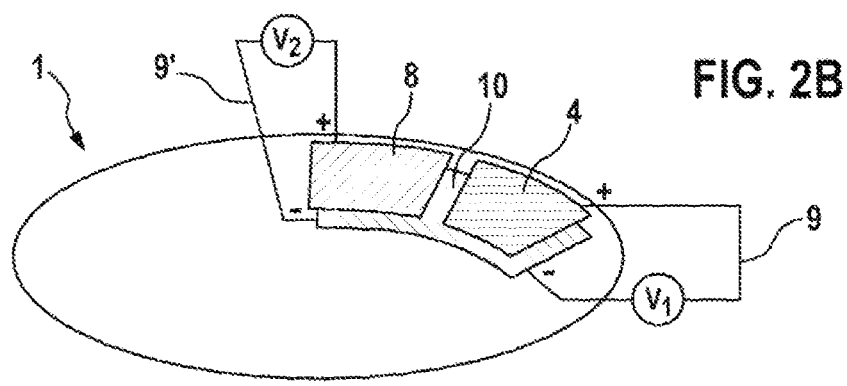

FIGS. 2A and 2B illustrate two specific embodiments of EAP stacks 1 according to the present invention, which differ from each other in the design of their electrodes. FIGS. 2A and 2B only indicate the top side of an EAP stack 1, but not the side. FIG. 2A shows one specific embodiment of an EAP stack 1 in which each of planar electrodes 4, 8 of one winding of the spiral are situated congruently over a separate planar electrode 4', 8' of the preceding winding of the spiral. The layer of electroactive polymer situated between electrodes 4, 8 and 4', 8' is not shown. Electrical energy may be supplied to the particular electrode pairs from electrodes 4, 4' or 8, 8' congruently situated on top of each other, or may be discharged from these, via separate circuits 9, 9'.

FIG. 2B shows one specific embodiment of an EAP stack 21 in which two separate planar electrodes 4, 8 of one winding of the spiral are situated over a planar electrode 10 of the preceding winding of the spiral, the joint surface of separate electrodes 4, 8 essentially corresponding to the surface of electrode 10. The layer of electroactive polymer situated between electrodes 4, 8 and 10 is not shown. Electrical energy may be supplied to the particular electrode pairs from electrodes 4, 10 or 8, 10, or may be discharged from these, via separate circuits 9, 9'.

Figure 3:
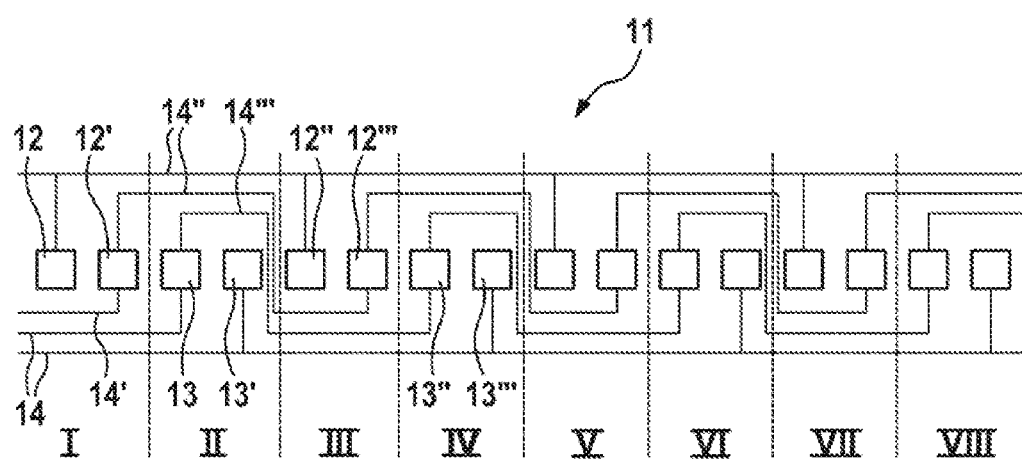
FIG. 3 shows a circuit diagram of an embodiment of the EAP stack.

FIG. 3 shows circuit diagram 11 of one specific embodiment having two electrodes per winding of the spiral-shaped EAP stack. One group in each case of two electrodes 12, 12' and 12", 12''' as well as 13, 13' and 13", 13''', which in each case are consecutive in the circuit diagram, represent the electrodes of one winding of the spiral-shaped EAP stack. The individual windings of the spiral-shaped EAP stack are indicated by the sections denoted by Roman numerals below the circuit diagram. Electrodes 12, 12' and 12", 12''' represent the signal electrodes, while electrodes 13, 13' and 13", 13''' represent the ground electrodes. The ground electrodes and the signal electrodes are connected to each other via electrically conductive connections 14.

Figure 4:
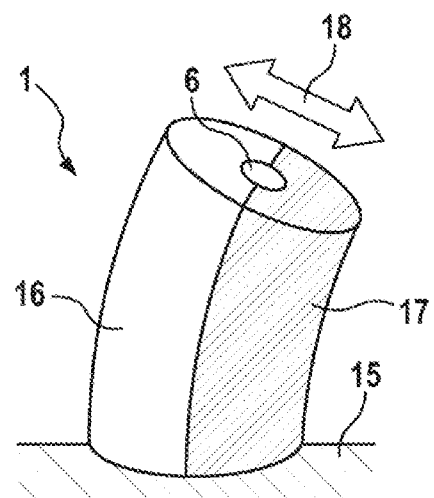
FIG. 4 illustrates the function of the EAP stack shown in FIG. 3.

One EAP stack having an arrangement of electrodes in accordance with FIG. 3 is shown in FIG. 4, which illustrates the function of such an EAP stack. One of the two ends of EAP stack 1 is attached to a support 15 and has two ring sectors 16, 17. Each of the two ring sectors includes a number of electrodes which are congruently situated on top of each other and which are separated from each other in each case by a layer of electroactive polymer. The cross section of each of the two ring sectors 16, 17 corresponds approximately to half the cross section of EAP stack 1.

By deflecting the free end of EAP stack 1 in the plane of double arrow 18 along the directions indicated by the tips of the arrows, the movement of EAP stack 1 may be converted into electrical energy when the EAP generator is operated in generator mode. As a result of coordinated, essentially alternating, action upon the layers made of electroactive polymer of both ring sectors 16, 17 of EAP stack 1 when the EAP generator is operated in actuator mode, the EAP stack is bendable in the directions shown by double arrow 18, i.e., in the direction of the two ring sectors 16, 17.

Figure 5:
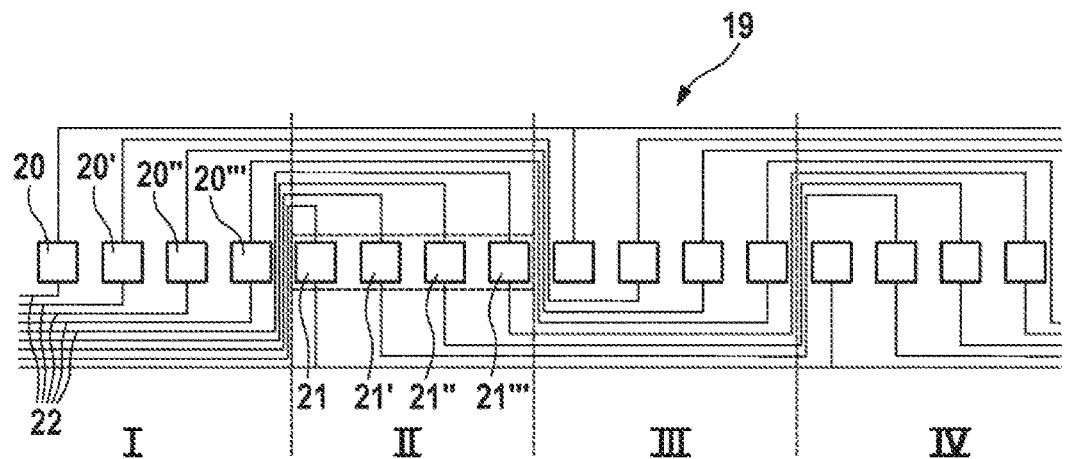
FIG. 5 shows a circuit diagram of another embodiment of the EAP stack.

FIG. 5 shows circuit diagram 19 of one specific embodiment having four electrodes per winding of the spiral-shaped EAP stack. One group in each case of four electrodes 20, 20' and 20", 20''' as well as 21, 21' and 21", 21''', which in each case are consecutive in the circuit diagram, represent the electrode of one winding of the spiral-shaped EAP stack. The individual windings of the spiral-shaped EAP stack are indicated by the sections denoted by Roman numerals below the circuit diagram. Electrodes 20, 20' and 20", 20''' represent the signal electrodes, while electrodes 21, 21' and 21", 21''' represent the ground electrodes. The ground electrodes and the signal electrodes are connected to each other via electrically conductive connections 22.

Figure 6:
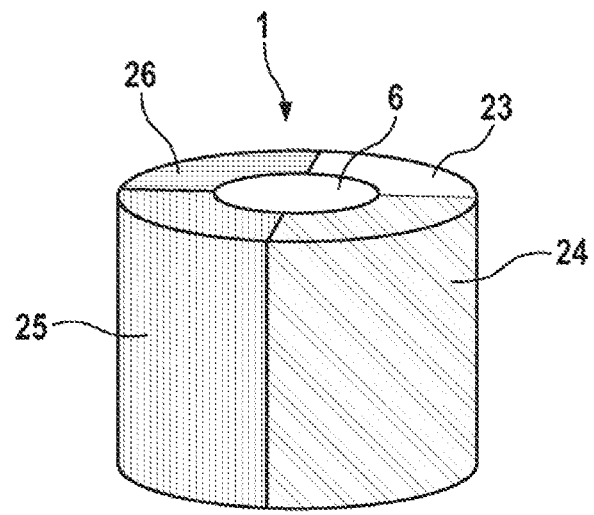
FIG. 6 illustrates the composition of the EAP stack shown in FIG. 5.

One EAP stack having an arrangement of electrodes in accordance with FIG. 5 is shown in FIG. 6, which illustrates the composition of such an EAP stack. The EAP stack has four ring sectors 23, 24, 25, 26. Each of the four ring sectors includes a number of electrodes which are congruently situated on top of each other and which are separated from each other in each case by a layer of electroactive polymer. The cross section of each of the four ring sectors 23, 24, 25, 26 corresponds approximately to one quarter of the cross section of EAP stack 1.

By deflecting the EAP stack in any arbitrary direction, the movement of EAP stack 1 may be converted into electrical energy when the EAP generator is operated in generator mode. As a result of coordinated action upon the layers made of electroactive polymer of each ring sector 23, 24, 25, 26 when the EAP generator is operated in actuator mode, the EAP stack is bendable in any arbitrary direction. In this way, for example, electromechanical fingers may be designed, whose finger tips are able to carry out circular movements.

What is claimed is:

1. An electroactive polymer stack, comprising:
a spirally wound strip, the strip having a planar surface extending in a length and a width, the length being larger than the width, and the strip further having a thickness which is smaller than the length and the width, the strip being wound about a center axis in such a way that the width of the planar surface extends in a direction perpendicular to the center axis, wherein the strip has one layer of an electroactive polymer and planar electrodes applied to sections of the electroactive polymer layer, and wherein multiple planar electrodes which do not directly adjoin each other on the strip prior to being wound are congruently situated on top of each other after being wound, in each case two planar electrodes which are situated on top of each other being separated from each other by at least one layer of the electroactive polymer.

2. The electroactive polymer stack as recited in claim 1, wherein the electroactive polymer stack has one of (i) two ring sectors, (ii) three ring sectors, or (iii) four ring sectors, which represent electrodes situated congruently on top of each other.

3. The electroactive polymer stack as recited in claim 1, wherein the electroactive polymer stack has a rod which is (i) situated in a cavity delimited by the inner circumference of the spiral and (ii) surrounded by the spiral in a form-locked manner.

4. The electroactive polymer stack as recited in claim 3, wherein the rod has one of a circular, oval, triangular, quadrangular, polygonal or star-shaped cross section.

5. A method for manufacturing an electroactive polymer generator, comprising:

spirally winding a strip about a center axis, the strip including a layer of an electroactive polymer and multiple planar electrodes applied to sections of the electroactive polymer layer, wherein the strip is spirally wound in such a way that multiple planar electrodes are situated congruently on top of each other, in each case two planar electrodes which are situated on top of each other being separated from each other by at least one layer of the electroactive polymer;

wherein the strip has a planar surface extending in a length and a width, the length being larger than the width, and the strip further has a thickness which is smaller than the length and the width, the strip being wound in such a way that the width of the planar surface of the strip extends in a direction perpendicular to the center axis.

6. The method as recited in claim 5, wherein in each case two electrodes situated on top of each other do not immediately adjoin each other relative to the strip.

7. The method as recited in claim 6, wherein each winding of the strip is carried out in such a way that one of every second, third or fourth electrode of the strip is situated congruently on top of each other in the stack.

8. The method as recited in claim 7, wherein the windings of the spiral are joined to each other or held together.

9. The method as recited in claim 7, wherein the strip is wound around a rod in a form-locked manner, the rod having one of a circular, oval, triangular, quadrangular, polygonal or star-shaped cross section.

* * * * *